(12) United States Patent
Hartl

(10) Patent No.: US 6,580,848 B2
(45) Date of Patent: Jun. 17, 2003

(54) INTERFACE FOR LIGHT BARRIER ARRANGEMENTS

(75) Inventor: Paul Hartl, München (DE)

(73) Assignee: Leuze lumiflex GmbH & Co. KG, Munich (DE)

( * ) Notice: Subject to any disclaimer, the term of this patent is extended or adjusted under 35 U.S.C. 154(b) by 0 days.

(21) Appl. No.: 09/954,094

(22) Filed: Sep. 17, 2001

(65) Prior Publication Data

US 2002/0033515 A1 Mar. 21, 2002

(30) Foreign Application Priority Data

Sep. 20, 2000 (DE) .......................... 100 46 863

(51) Int. Cl.[7] .............................. G02B 6/26; G02B 6/42
(52) U.S. Cl. .............................. 385/16; 385/15; 385/57; 385/88; 439/577; 257/80; 257/432
(58) Field of Search ................. 385/14–16, 88, 385/57; 439/577; 257/432, 80

(56) References Cited

U.S. PATENT DOCUMENTS

| | | | | |
|---|---|---|---|---|
| 4,903,340 A | * | 2/1990 | Sorensen | 359/159 |
| 5,261,015 A | * | 11/1993 | Glasheen | 385/23 |
| 5,930,416 A | * | 7/1999 | Worm et al. | 340/815.48 |
| 6,253,010 B1 | * | 6/2001 | Belser et al. | 356/400 |
| 6,366,714 B1 | * | 4/2002 | DeBoynton et al. | 385/16 |

FOREIGN PATENT DOCUMENTS

DE         42 16 242 A1    11/1993

* cited by examiner

Primary Examiner—Brian Healy
Assistant Examiner—Daniel Petkovsek
(74) Attorney, Agent, or Firm—Venable LLP; Robert Kinberg; Jung (John) Kim

(57) ABSTRACT

An interface for light barrier arrangements operates with an optoelectronic data exchange that can be activated by means of a magnetically acutated switch.

20 Claims, 2 Drawing Sheets

INTERFACE FOR LIGHT BARRIER ARRANGEMENTS

BACKGROUND OF THE INVENTION

The invention pertains to an interface for light barrier arrangements.

In this context, the term "light barrier arrangement" refers to optoelectronic sensors that serve for monitoring a hazardous area, e.g., individual light barriers, light screens, light curtains, etc. Light barrier arrangements of this type contain control electronics that need to be configured in accordance with the respective conditions before commissioning, i.e., the control electronics need to be programmed or read out for diagnostic purposes. Conventional light barrier arrangements contain an interface for this purpose, wherein a socket, into which a diagnosis plug can be inserted, is screwed onto the interface. The process of screwing on the connecting socket is complicated and time-consuming. In addition, this can lead to sealing problems or the loss of individual parts, e.g., screws, etc. In addition, the attachment of the diagnosis interface may cause a maladjustment of the light barrier arrangement. This is particularly problematic if it is intended to use auxiliary diagnostic means for controlling the adjustment.

DE 42 16 242 A1 describes an interface component for sensors, e.g., light barriers, which contains a data interface and a parameter interface for connecting the sensors. In a configuration mode that is initiated by the switching operation of a magnetic switch, data are exchanged between a control unit and the sensors via the parameter interface.

SUMMARY OF THE INVENTION

The invention is based on the objective of improving an interface for light barrier arrangements in such a way that it has a simple design, can be easily handled and ensures a high degree of protection against dirt and moisture.

The basic principle of the invention consists of an optoelectronic data exchange that can be activated by a magnetically actuated switch.

The light barrier arrangement contains an interface component with a first optoelectronic communication device and the magnetically actuated switch. The magnetically actuated switch may simply consist of a "Reed contact." However, it would also be conceivable to utilize electromagnetic components, e.g., a photoresistance cell controlled by a magnetic field, Hall generators or electromagnetic sensors in the form of integrated circuits. The first communication device and the magnetically actuated switch cooperate with an external interface element that can be "connected" or "attached" to the interface component of the light barrier arrangement, wherein said interface element contains an assigned second optoelectronic communication device and a magnet for actuating the switch. The first communication device contains a light transmitting element and a light receiving element in order to realize an infrared connection between the external interface element and the light barrier arrangement. The external interface element contains a communication device that is either realized in the form of a pair of light transmitting and light receiving elements or an optical waveguide, e.g., a fiber-optic waveguide, a prism or a mirror arrangement, for feeding the light emitted by the first communication device back to its light receiving element.

According to one additional development of the invention, the external interface element contains a connection or a cable for connection to a configuration/diagnostic device, e.g., a PC.

For certain operating modes, the external interface element contains a "looped-through" optical waveguide that optically connects the light transmitting element and the light receiving element of the external interface element to one another. Consequently, this interface element may serve for "optically short-circuiting" the first communication device, i.e., the light transmitting element of the interface component can be optically connected to the light receiving element of the interface component via the external interface element.

The light transmitting element and the light receiving element, as well as the magnetically actuated switch, are arranged behind a transparent and magnetically permeable cover plate. The magnet is preferably so strong that the external interface element and, if applicable, the cable can be fixed on a vertically arranged cover plate of the light barrier arrangement solely by means of magnetic forces.

According to one additional development of the invention, the external interface element and the light barrier arrangement are designed such that the first and the second light transmitting and light receiving elements are aligned relative to one another solely by means of the magnetic forces when "attaching" the external interface element to the light barrier arrangement such that flawless data transmission is ensured. In other words, the switch is only actuated when the optical elements are correctly aligned relative to one another.

According to another additional development of the invention, the light transmitting element, the light receiving element and the magnetically actuated switch are connected to control electronics, wherein a separate controller may be respectively assigned to the light transmitting element and the light receiving element.

Consequently, the invention allows simple placement of the external interface element on the light barrier arrangement and reliable data exchange via an infrared connection. In this case, the magnet that is integrated into the external interface element automatically actuates the switch and thus activates the interface for a change-over into the configuration or diagnostic mode.

Other objects and features of the present invention will be in part apparent and in part pointed out hereinafter.

BRIEF DESCRIPTION OF THE DRAWINGS

Corresponding reference characters indicate corresponding parts throughout the several views of the drawings.

DETAILED DESCRIPTION OF THE PREFERRED EMBODIMENT

Figure 1:
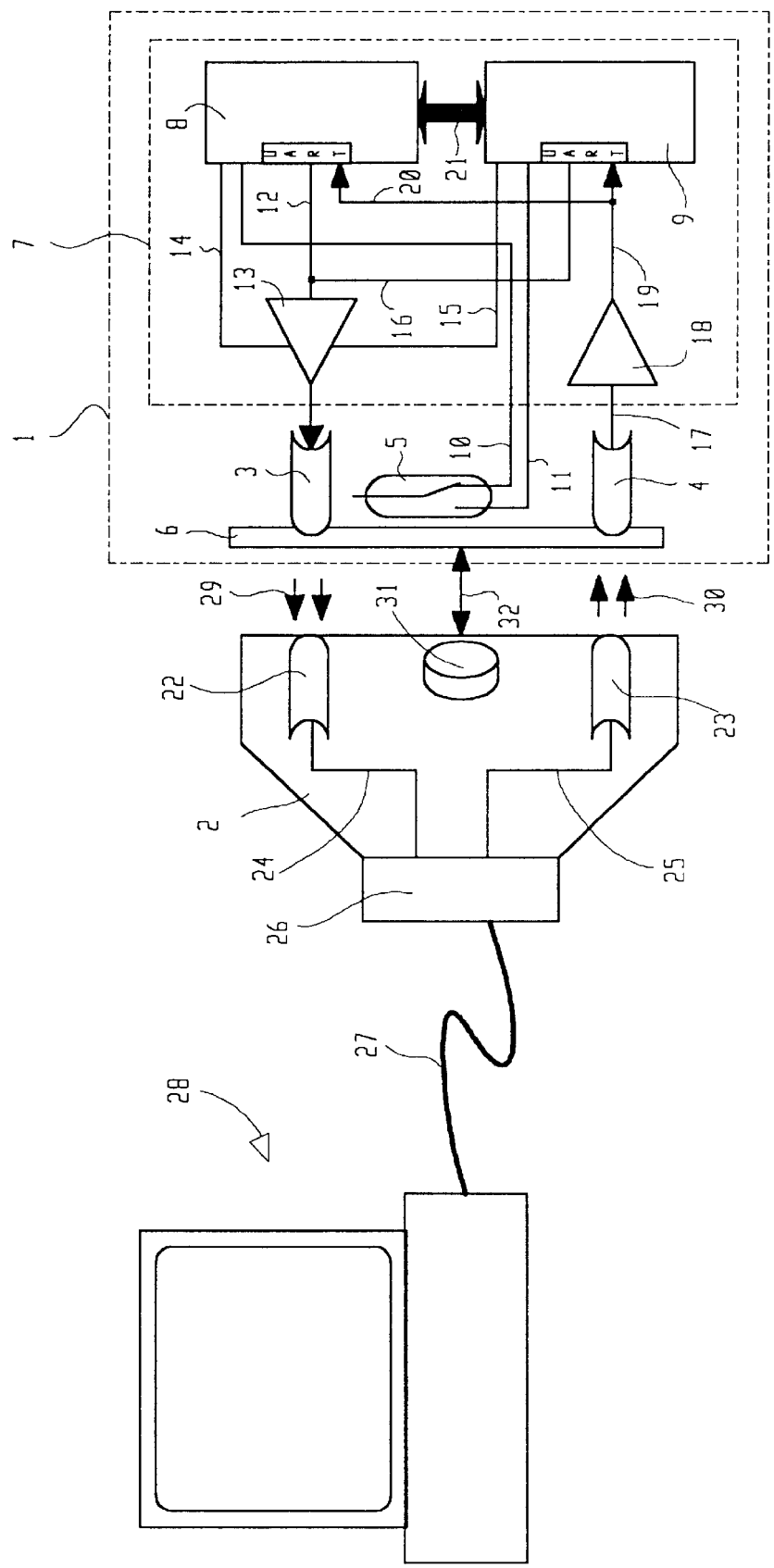
FIG. 1 is a first embodiment of the invention for a first operating mode.

FIG. 1 shows an interface for light barrier arrangements with a first interface component 1 and an external interface element 2 that can be connected thereto. The first interface component 1 may form an integral component of a light barrier arrangement that contains a series of (not-shown) light transmitting elements and light receiving elements.

The first interface component 1 contains a first light transmitting element 3, a first light receiving element 4 and a magnetically actuated switch 5 which are arranged behind a transparent cover plate 6. The first light transmitting element 3, the first light receiving element 4 and the magnetically actuated switch 5, e.g., a "Reed switch," are connected to a microprocessor control 7. The microprocessor control 7 contains a first controller 8 and a second controller 9 which are respectively connected to the magnetically actuated switch 5 by means of assigned control lines 10, 11. The first controller 8 is also connected to the light transmitting element 3 via a line 12 and an amplifier 13. The amplifier 13 is connected to the respective controllers 8 and 9 via supply lines 14, 15. In addition, a line 16 leads from the input of the amplifier 13, i.e., from the line 12, to the controller 9.

The light receiving element 4 is connected to the controller 9 via a line 17 and an amplifier 18 and an amplifier output 19. In addition, a line 20 leads from the amplifier output 19 to the controller 8. The data exchange taking place between the two controllers is schematically illustrated in the form of the arrow 21.

The external interface element 2 contains a second light receiving element 22 and a second light transmitting element 23 which are connected to an output 26 via assigned lines 24, 25. The output 26 of the external interface element 2 is connected via a data line 27 to a configuration and diagnostic device that is schematically illustrated in the form of a PC 28 in this figure. For this purpose, the output 26 may be provided with an interface adapter for the PC, e.g., a conventional serial or parallel interface.

An optoelectronic data exchange that is schematically illustrated in the form of the arrows 29, 30 takes place between the light transmitting element 3 and the light receiving element 22, as well as between the light transmitting element 23 and the light receiving element 4. The external interface element 2 also contains a magnet 31, e.g., a permanent magnet. An actuation of the Reed switch 5 by the magnet 31 takes place when the external interface element 2 is "connected" or "attached" to the interface component 1. The field of the magnet 31 which excites the Reed switch 5 is schematically illustrated in the form of an arrow 32. Due to the "activation" of the Reed switch 5, the controllers 8, 9 are switched into a predetermined operating mode, e.g., a configuration and diagnostic mode, via the lines 10, 11.

In this operating mode, it is possible to transmit configuration data or programs from the PC 28 to the controller 8 and/or 9. However, it is also possible for the PC 28 to read out data from the controller 8 and/or 9. A transmission of configuration data is only accepted if both controllers 8, 9 are intact. Diagnostic data can, however, also be delivered if one of the controllers 8, 9 is defective.

Figure 2:
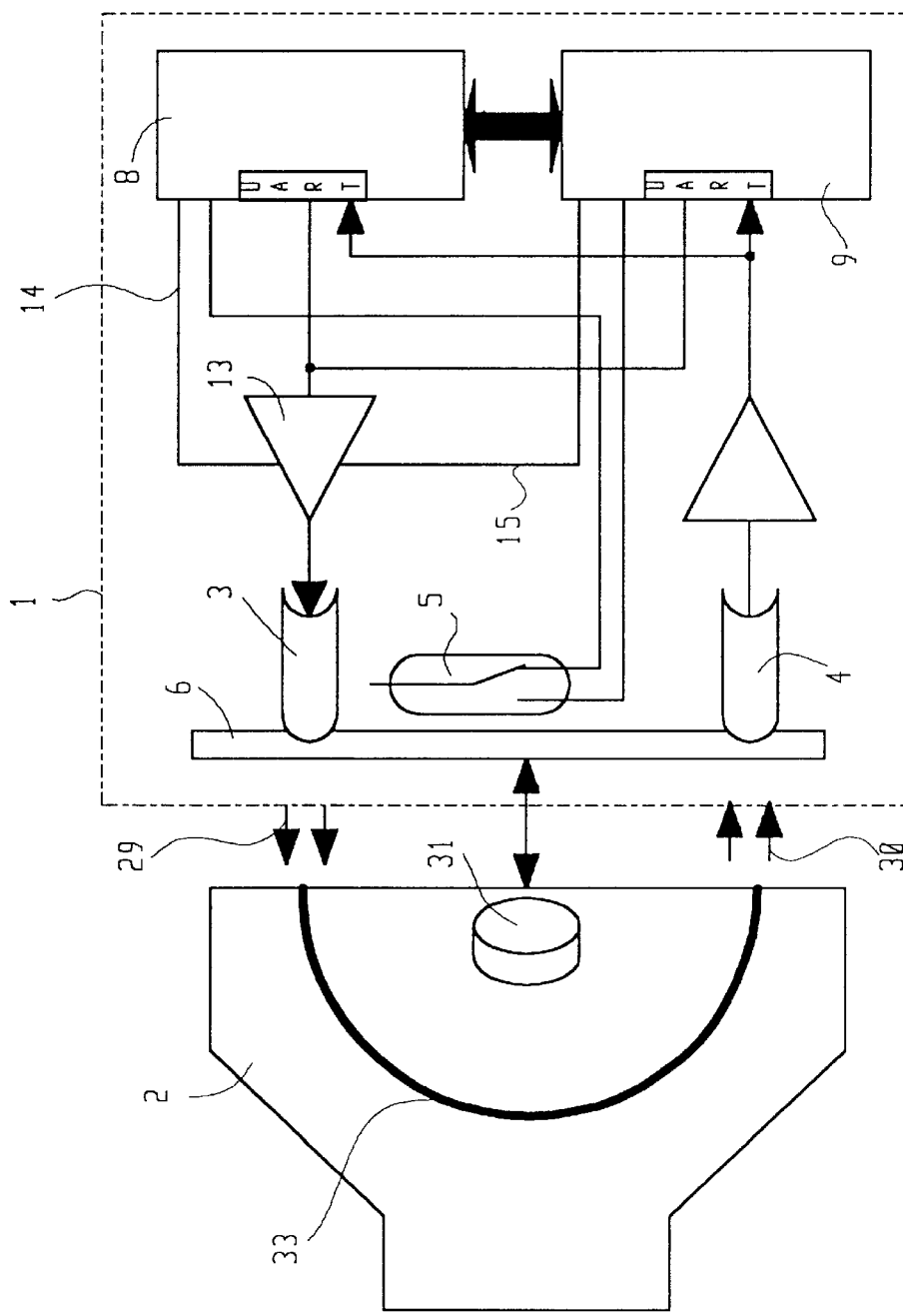
FIG. 2 is a second embodiment of the invention for a second operating mode.

FIG. 2 shows another embodiment of an external interface element 2 which is used for the so-called "Teach-in" mode.

In this operating mode, the amplification of not-shown light receiving elements of the light barrier is, for example, automatically adjusted. It is also possible to adjust threshold values for the light reception if individual beams are partially blanked. However, in so-called "fixed blanking," the optically interrupted light beams are no longer evaluated and thusly excluded from the active field of protection. The microprocessor control 7 recognizes this operating mode due to the fact that the switch 5 is changed over and the fact that the data transmitted by the light transmitting element 3 consequently is received by the light receiving element 4 in unchanged form.

The first interface component 1 is realized identically to that described above with reference to FIG. 1.

However, the external interface element 2 contains a "looped-through" optical waveguide 33 in this case. The Reed switch 5 is actuated via the magnet 31 by connecting the external interface 2 to the first interface component 1, namely such that the controllers 8, 9 are changed over into the configuration and diagnostic mode. The light emitted by the light transmitting element 3 is forwarded to the light receiving element 4 via the optical waveguide 33. This operating mode is referred to as the "Teach-in" mode. Instead of providing an optical waveguide 33, it would also be possible to realize optical feedback by means of a prism or a mirror arrangement ("ridge mirror" in a 90° arrangement).

The external interface element 2 consequently represents a simple, passive optomagnetic "key" that is protected from unauthorized manipulation and directly attached onto the front panel or cover plate 6 of the interface component 1 in order to directly route the data flow generated by the configuration interface, i.e., by the controller 8 and the amplifier 13 and by the light transmitting element 3, to the reception channel of the configuration interface, i.e., to the light receiving element and the controller 9. This type of "key depression stroke" is accepted by the receiver if:

a) the transmitted data flow 29 is recognized on the reception channel 30 within a very small time window and b) the Reed switch 5 is changed over by the permanent magnet 31 that is integrated into the "key" or into the external interface element 2.

Due to the large quantity of configuration data of the receiver, it is impossible to exclusively select said configuration data with switches, e.g., with DIP-switches. Consequently, only individual master parameters are defined by means of (not-shown) DIP-switches. In addition, configuration data that are stored in a non-volatile EEPROM memory can be configured via PC or Teach-in.

The configuration interface serves for the bidirectional transmission of configuration and diagnostic data and makes it possible to connect a configuration and diagnostic device, in particular, a PC (FIG. 1). The data transmission takes place optically through the front panel 6 of the receiver. Both controllers 8, 9 evaluate the received data and carry out a cross-check. Data to be transmitted are only transmitted by the controller 8 after a cross-check, wherein the controller 8 contributes the useful data and the controller 9 contributes the check sum. As an additional safety measure, the Reed contact 5 that is evaluated by the controllers 8, 9 needs to be closed magnetically by the external interface element 2.

The magnet 31 of the external interface element 2 is preferably sufficiently strong such that the interface element 2 with its cable 27 (FIG. 1) is held on the first interface component 1, i.e., on the vertical cover plate 6 according to FIGS. 1 and 2, solely by the generated magnetic forces. The magnet 31 "automatically" positions the interface element 2 on the cover plate 6 such that the light transmitting elements are aligned relative to the assigned light receiving elements and a reliable data exchange is ensured.

The cover plate is installed at the factory into a not-shown housing in such a way that the interior of the housing is completely sealed from the outside. This also makes it possible to easily achieve a very high class of protection, e.g., protection class IP65, namely in both of the above-described operating modes in which the components arranged in the interior of the housing exchange data with the outside of the housing.

An integrated adjusting laser may be switched on for a certain duration in order to support the mechanical alignment of the light barrier arrangement by attaching an external magnet with or without optical communication or direct optical feedback. It would be conceivable to realize this with a simple magnet that consequently has no optical feedback as described above with reference to FIG. 2 and also no optical communication as described above with reference to FIG. 1. This makes it possible to define an operating hierarchy, for example, such that machine operators are merely provided with a magnet and switch on the adjustment laser in case of a mechanical maladjustment while machine adjusters are permitted to operate in the "Teach-in" mode and consequently are provided with a magnet with optical feedback. In this case, system administrators have access to a PC in order to exchange data via the interface according to FIG. 1.

In view of the above, it will be seen that that the several objects of the invention are achieved and other advantageous results attained.

When introducing elements of the present invention or the preferred embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above constructions without departing from the scope of the invention, it is intended that all matter contained in the above description or shown in the accompanying drawings shall be interpreted as illustrative and not in a limited sense.

What is claimed is:

1. An interface for a light barrier arrangement comprising:
    an interface component mountable in the light barrier arrangement, the interface component comprising a first optoelectronic communication device and a magnetically actuated switch for switching the first communication device into a predetermined operating mode, wherein the first communication device comprises a first light transmitting element and a first light receiving element for respectively transmitting and receiving at least one of configuration data and diagnostic data, and
    an external interface element comprising a magnet for actuating the switch and a second optoelectronic communication device assigned to the first communication device, wherein the second communication device of the external interface element comprises a light deflection device, a second light receiving element assigned to the first light transmitting element and a second light transmitting element assigned to the first light receiving element, and wherein the second light receiving element and the second light transmitting element are connected to one another via the light deflection device.

2. The interface of claim 1, wherein the first communication device comprises a microprocessor control to which the first light transmitting element, the first light receiving element and the switch are connected.

3. The interface of claim 2, wherein the microprocessor control comprises two separate controllers that are respectively assigned to the first light transmitting element and to the first light receiving element.

4. The interface of claim 3, wherein the switch is connected to the controllers via assigned control lines.

5. The interface of claim 1, wherein the external interface element comprises a connection for connecting at least one of the second light receiving element and the second light transmitting element to a computer.

6. The interface of claim 1, wherein the light deflection device comprises an optical waveguide.

7. The interface of claim 1, wherein the switch responds to a magnetic field.

8. The interface of claim 1, wherein the switch is selected from the group consisting of a Reed contact, a photoresistance cell controlled by a magnetic field, a Hall generator and an electromagnetic sensor.

9. The interface of claim 8, wherein the switch is an integrated circuit.

10. The interface of claim 2, wherein a series of light transmitting elements and light receiving elements for monitoring a hazardous area are connected to the microprocessor control.

11. An interface for a light barrier arrangement comprising:
    an interface component mountable in the light barrier arrangement, the interface component comprising a first optoelectronic communication device and a magnetically actuated switch for switching the first communication device into a predetermined operating mode, and
    an external interface element comprising a magnet for actuating the switch and a second optoelectronic communication device assigned to the first communication device, wherein the external interface element is fixed on the interface component of the light barrier arrangement solely by magnetic forces of the magnet.

12. The interference of claim 11, wherein the interface component and the external interface element are sized and shaped such that the external interface element is automatically aligned with the interface component by magnetic forces when the external interface element is attached to the interface component.

13. The interface of claim 11, wherein the first communication device comprises a first light transmitting element and a first light receiving element for respectively transmitting and receiving at least one of configuration data and diagnostic data.

14. The interface of claim 13, wherein the second communication device of the external interface element comprises a second light receiving element assigned to the first light transmitting element and a second light transmitting element assigned to the first light receiving element.

15. The interface of claim 14, wherein at least one of the light barrier arrangement and the external interface element is sized and shaped such that the magnet triggers the switch only if the first and second light transmitting elements and first and second light receiving elements are properly aligned relative to one another.

16. The interface of claim 14, wherein the second communication device of the external interface element further comprises a light deflection device and the second light receiving element and the second light transmitting element are connected to one another via the light deflection device.

17. An interface for a light barrier arrangement comprising:
    an interface component mounted in the light barrier arrangement, the interface component comprising a first optoelectronic communication device and a magnetically actuated switch for switching the first communication device into a predetermined operating mode,
    an external interface element comprising a magnet for actuating the switch and a second optoelectronic communication device assigned to the first communication device, and
    an adjusting laser capable of being switched on for a predetermined duration by the magnet for actuating the switch.

18. The interface of claim 17, wherein the first communication device comprises a first light transmitting element and a first light receiving element for respectively transmitting and receiving at least one of configuration data and diagnostic data.

19. The interface of claim 18, wherein the second communication device of the external interface element comprises a second light receiving element assigned to the first light transmitting element and a second light transmitting element assigned to the first light receiving element.

20. The interface of claim 19, wherein the second communication device of the external interface element further comprises a light deflection device and the light receiving element and the second light transmitting element are connected to one another via the light deflection device.

* * * * *